United States Patent [19]

Johannsmeier

[11] 3,844,655

[45] Oct. 29, 1974

[54] METHOD AND MEANS FOR FORMING AN ALIGNED MASK THAT DOES NOT INCLUDE ALIGNMENT MARKS EMPLOYED IN ALIGNING THE MASK

[75] Inventor: Karl-Heinz Johannsmeier, Mountain View, Calif.

[73] Assignee: Kasper Instruments, Inc., Mountain View, Calif.

[22] Filed: July 27, 1973

[21] Appl. No.: 383,043

[52] U.S. Cl. ........................ 355/43, 355/75, 355/77, 355/78, 355/86, 355/95

[51] Int. Cl. ........................................ G03b 27/70

[58] Field of Search ............ 355/77, 78, 43, 75, 86, 355/95, 132

[56] References Cited

UNITED STATES PATENTS

| | | | |
|---|---|---|---|
| 3,476,476 | 11/1969 | Chitayat | 355/86 UX |
| 3,490,846 | 1/1970 | Kasper | 355/78 |
| 3,591,284 | 7/1971 | Liebman | 355/75 |
| 3,602,591 | 8/1971 | Bouwer et al. | 355/95 X |
| 3,635,558 | 1/1972 | LePeer et al. | 355/75 X |
| 3,718,396 | 2/1973 | Hennings | 355/43 |

*Primary Examiner*—Joseph F. Peters, Jr.
*Assistant Examiner*—Richard A. Wintercorn
*Attorney, Agent, or Firm*—Roland I. Griffin

[57] ABSTRACT

An automatic alignment and exposure system is employed for aligning a pair of alignment marks on a semiconductive wafer with a corresponding pair of alignment marks on a photomask to align the semiconductive wafer with the photomask. The automatic alignment and exposure system is also employed for directing exposure light through the alignment-mark-containing portions of the photomask onto corresponding portions of a photosensitive film of etch-resistant material on the semiconductive wafer to fully expose those portions of the photosensitive film and for directing exposure light through the photomask onto the entire unmasked surface of the photosensitive film to selectively expose the photosensitive film in accordance with the pattern of the photomask. Following this exposure operation, either the unexposed or the exposed portions of the photosensitive film are removed from the semiconductive wafer, thereby leaving an etch-resistant mask that does not include the alignment marks of the photomask.

11 Claims, 6 Drawing Figures

METHOD AND MEANS FOR FORMING AN ALIGNED MASK THAT DOES NOT INCLUDE ALIGNMENT MARKS EMPLOYED IN ALIGNING THE MASK

BACKGROUND AND SUMMARY OF THE INVENTION

This invention relates generally to the formation of high resolution masks upon a workpiece, such as a semiconductive wafer, and more particularly to a method and means for reducing the amount of space required for alignment marks upon a semiconductive wafer in order to successively form a plurality of high resolution masks upon the semiconductive wafer in precise alignment with respect to one another.

In the fabrication of integrated circuits and other semiconductive devices, a semiconductive wafer is subjected to various deposition, diffusion, and etching steps. Many of these steps require the formation of a high resolution oxide mask of a desired pattern on the semiconductive wafer. Each such oxide mask is typically formed by growing an oxide layer on the semiconductive wafer, depositing a photosensitive film of an etch-resistant material on the oxide layer, directing exposure light through a corresponding photomask of the desired pattern onto the entire unmasked surface of the photosensitive film, removing either the unexposed or the exposed portions of the photosensitive film to form an etch-resistant mask of the desired pattern on the oxide layer, and selectively etching the oxide layer through this etch-resistant mask to form an oxide mask of the desired pattern on the semiconductive wafer. The first such oxide mask typically defines either a single pair of spaced alignment marks of a first type, such as a pair of spaced single crosses, to be etched into or otherwise formed on the semiconductive wafer for use in alignment of the next remaining oxide mask, or a separate pair of such spaced alignment marks for use in alignment of each of the remaininng oxide masks. In the first-mentioned case, each of the remaining oxide masks also typically defines a pair of such spaced alignment marks for use in alignment of the next remaining oxide mask. However, in either case, in forming each of the remaining oxide masks, the corresponding pair of spaced alignment marks on the semiconductive wafer is aligned with a corresponding pair of spaced alignment marks of a second type, such as a pair of spaced double crosses, on the corresponding photomask before exposure light is directed through the corresponding photomask onto the photosensitive film. This enables each of the remaining oxide masks to be formed on the semiconductive wafer in precise alignment with respect to the first oxide mask and, hence, each of the oxide masks to be formed on the semiconductive wafer in precise alignment with respect to one another. The above-mentioned alignment and exposure operations are typically performed either with a manually-operated alignment and exposure system such as that shown and described in U.S. Pat. No. 3,490,846 or, more efficiently, with an automatic alignment and exposure system such as that shown and described in copending U.S. Pat. application Ser. No. 305,861 entitled APPARATUS FOR THE AUTOMATIC ALIGNMENT OF TWO SUPERIMPOSED OBJECTS, E.G. A SEMICONDUCTOR WAFER AND MASK, filed on June 12, 1972, by Karl-Heinz Johannsmeier et al., and assigned to the same assignee as the present application.

A separate pair of spaced alignment marks of the first type must be formed on the semiconductive wafer for each of the remaining oxide masks because directing exposure light through the photomask onto the entire unmasked surface of the photosensitive film typically does not expose those portions of the photosensitive film masked by the pair of spaced alignment marks of the second type on the photomask. The pair of spaced alignment marks of the second type is therefore ultimately defined and formed on the semiconductive wafer over the corresponding pair of spaced alignment marks of the first type. This prevents each pair of spaced alignment marks of the first type on the semiconductive wafer from being used effectively in the formation of more than one oxide mask upon the semiconductive wafer and prevents the space occupied by each such pair of spaced alignment marks on the semiconductive wafer from being used for another pair of spaced alignment marks of the first type (particularly when the alignment operation is performed by an automatic alignment and exposure system). Every additional alignment mark that must be formed on the semiconductive wafer takes up valuable space that might otherwise be used for integrated circuits or other semiconductive devices to be fabricated from the semiconductive wafer. Moreover, since the pairs of spaced alignment marks on the semiconductive wafer must be spaced sufficiently far apart to prevent the alignment marks of one pair from being confused with the alignment marks of another pair, even more valuable space is taken up that might otherwise be used for integrated circuits or other semiconductive devices to be fabricated from the semiconductive wafer.

Accordingly, it is the principal object of this invention to provide a method for forming an aligned etch-resistant or oxide mask that does not include the alignment marks of the photomask employed in forming the aligned mask and therefore significantly reduces the amount of space required for alignment marks on the semiconductive wafer. This object is accomplished according to the preferred embodiment of this invention by directing exposure light onto portions of the photosensitive film masked by the alignment marks of the photomask to fully expose those portions of the photosensitive film before the unexposed or exposed portions of the photosensitive film are removed from the semiconductive wafer to define the etch-resistant mask thereon. The alignment marks on the photomask are therefore prevented from forming part of the etch-resistant mask, thereby permitting a single pair of spaced alignment marks of the first type on the semiconductive wafer to be used in the formation of more than one oxide mask on the semiconductive wafer, reducing the amount of space required for alignment marks on the semiconductive wafer, and increasing the amount of space that may be used for fabricating integrated circuits and other semiconductive devices from the semiconductive wafer.

In accordance with the preferred embodiment of this invention, an automatic alignment and exposure system, such as tha shown and described in the above-mentioned patent application, may be employed to perform the alignment and exposure operations in forming an etch-resistant mask that does not include the alignment marks of the photomask. For this purpose the automatic alignment and exposure system is provided with a split-field objective lens system for detecting the position of the pair of spaced alignment marks of the first type on the semiconductive wafer relative to the position of the corresponding pair of spaced alignment marks of the second type on the photomask. It is also provided with a control system for automatically moving the semiconductive wafer relative to the photomask in response to the detected relative positions of these pairs of spaced alignment marks as required to bring them into alignment. The automatic alignment and exposure system is further provided with an illumination and exposure system for directing illumination light through the split-field objective lens system and onto the photomask and the semiconductive wafer during the alignment operation. Following the alignment operation, the illumination and exposure apparatus is employed for directing exposure light through the split-field objective lens system and the alignment-mark-containing portions of the photomask onto the corresponding portions of the photosensitive film on the semiconductive wafer to fully expose those portions of the photosensitive film masked by the alignment marks of the photomask and thereby prevent the alignment marks of the photomask from becoming part of the etch-resistant mask. The illumination and exposure system is also employed for directing exposure light from a mirror through the photomask onto the entire unmasked surface of the photosensitive film. Either the unexposed or the exposed portions of the photosensitive film are thereafter removed to form a high-resolution etch-resistant mask that does not include the alignment marks of the photomask employed in forming the etch-resistant mask.

DESCRIPTION OF THE PREFERRED EMBODIMENT

Figure 1:
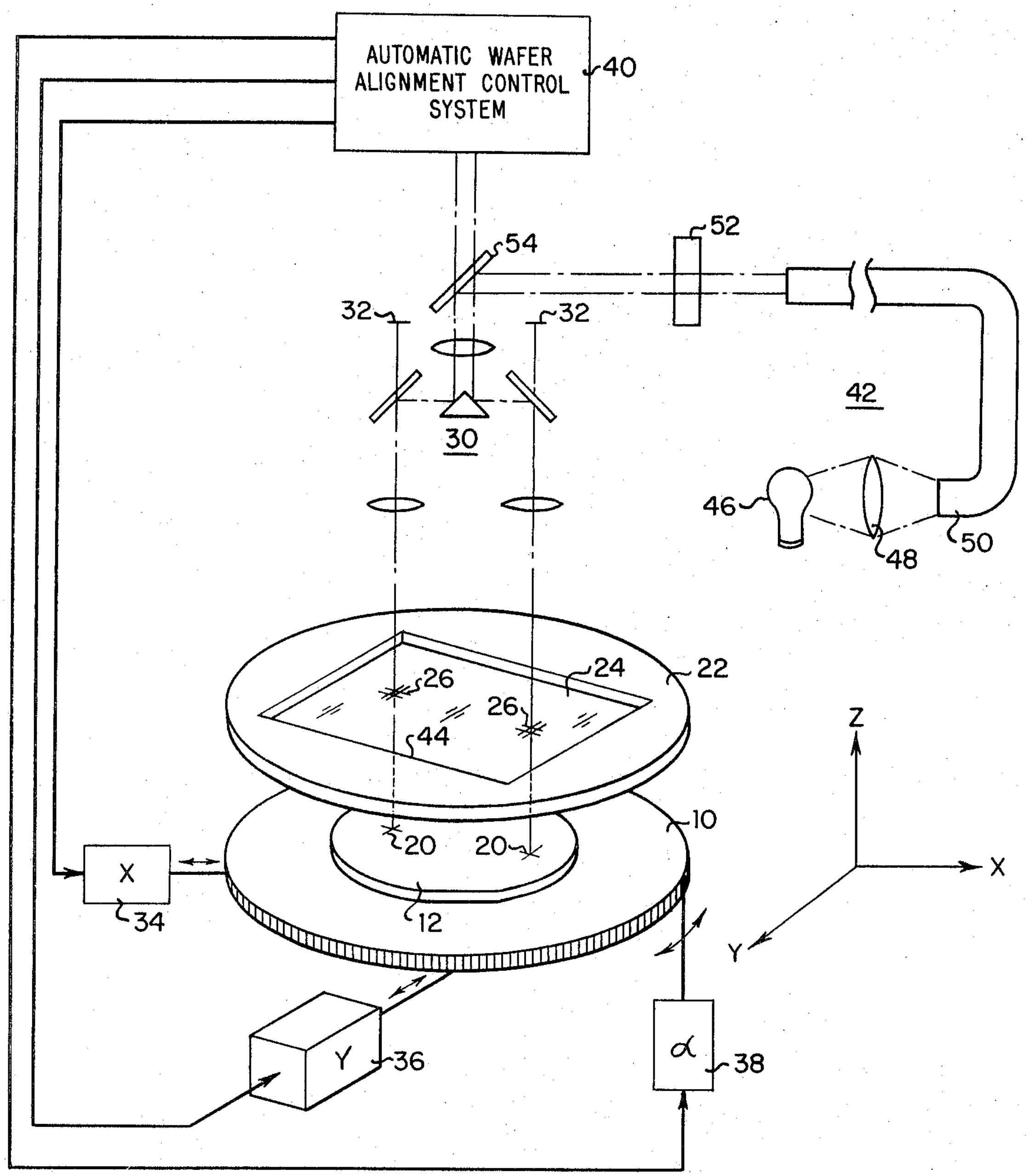
FIGS. 1 and 2 are schematic respresentations of an automatic alignment and exposure system that may be utilized for fabricating etch-resistant masks in accordance with the preferred embodiment of this invention.
Figure 2:
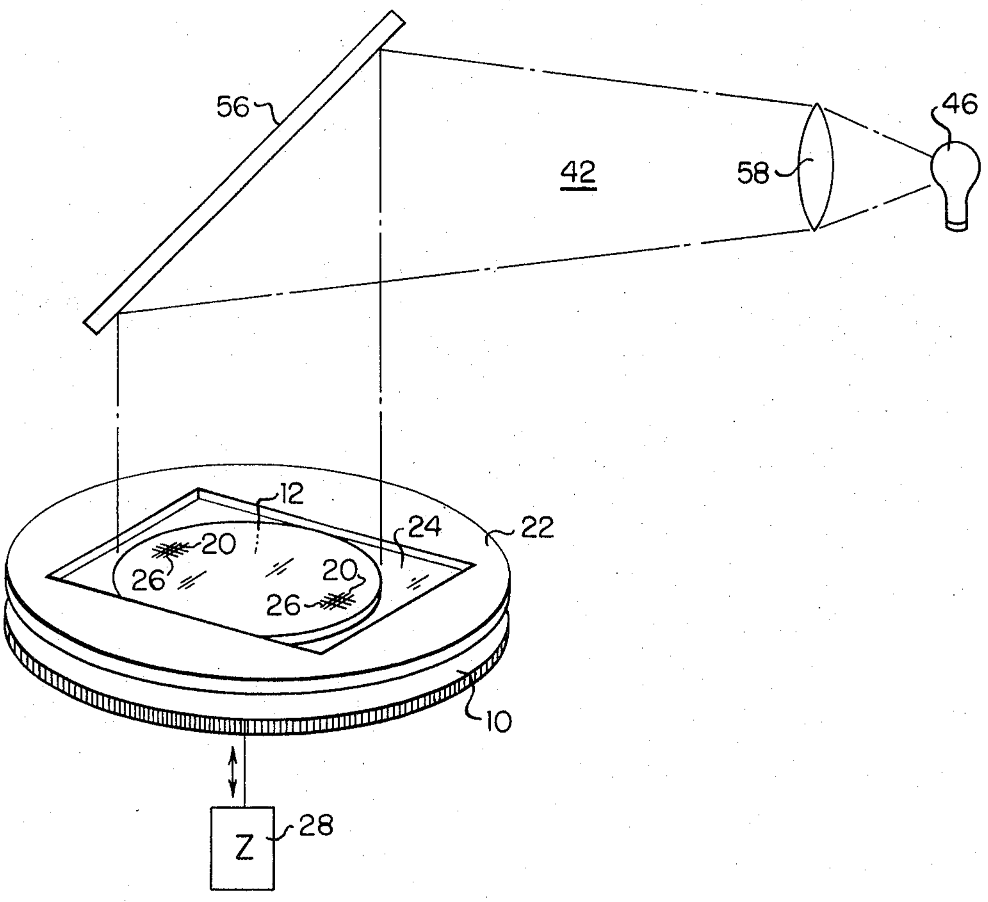
Figure 3:
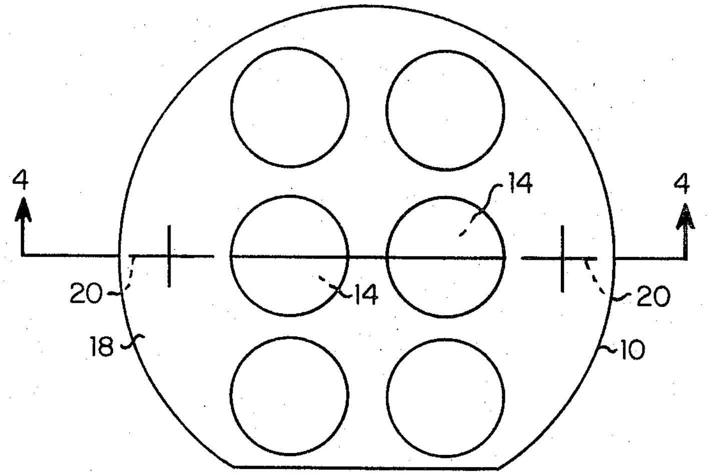
FIG. 3 is a plan view of a semiconductive wafer upon which a high-resolution oxide mask of a desired pattern is to be formed.
Figure 4:
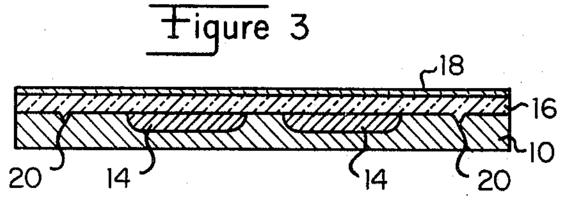
FIG. 4 is a cross-sectional side view of the semiconductive wafer of FIG. 3 taken along the line 4—4.

Referring now to FIGS. 1 and 2, there is shown an automatic alignment and exposure system that may be constructed as shown and described in detail in the above-mentioned patent application, except as otherwise described below in accordance with the preferred embodiment of this invention. This system includes a wafer chuck 10 for holding a semiconductive wafer 12 upon which an aligned high-resolution mask is to be formed as, for example, one step in the process of fabricating a plurality of microwave transistors from the semiconductive wafer. As shown in FIGS. 3 and 4, the semiconductive wafer 12 may comprise a silicon wafer in which the base regions 14 of the microwave transistors have previously been diffused through an oxide base diffusion mask (since removed) and on which a layer 16 of silicon dioxide has been formed and covered by a negative photosensitive film 18 of etch-resistant material in preparation for the formation of an oxide emitter diffusion mask. The semiconductive wafer 10 also includes a pair of spaced alignment marks 20 of a first type, such as a pair of spaced single crosses, previously etched into the semiconductive wafer to facilitate precise alignment of the oxide emitter diffusion mask with respect to the oxide base diffusion mask previously formed upon the semiconductive wafer and, hence, with respect to the base regions 14 formed with the aid of the oxide base diffusion mask.

A mask holder 22 for holding a transparent photomask 24 corresponding to the oxide emitter diffusion mask to be formed upon the semiconductive wafer 12 is mounted above the wafer chuck 10. The photomask 24 comprises, for example, a light field type of photomask on the lower surface of which the desired emitter diffusion pattern is defined by dark areas. It includes a pair of spaced alignment marks 26 of a second type, such as a pair of spaced double crosses, for alignment with the corresponding pair of spaced alignment marks 20 of the first type on the semiconductive wafer 12 to further facilitate precise alignment of the oxide emitter diffusion mask with respect to the base regions 14 of the semiconductive wafer. A reversible drive mechanism 28 (see FIG. 2) is employed to elevate the wafer chuck 10 along a vertical Z axis towards the mask holder 22 and thereby bring the oxide and photosensitive-film covered upper surface of the semiconductive wafer 12 into contact with the pattern bearing lower surface of the photomask 24 to establish parallel plane alignment therebetween. Following this parallel plane alignment operation, the reversible drive mechanism 28 is employed to lower the wafer chuck 10 a slight distance and thereby separate the semiconductive wafer 12 from the photomask 24 to permit out-of-contact alignment thereof.

As in a manually-operated alignment aand exposure system, the operator may initially position the semiconductive wafer 12 in coarse alignment with respect to the photomask 24 by employing a split-field objective lens system 30 to view an image of the alignment-mark-containing portions of the semiconductive wafer and the photomask at focal points 32 while controlling reversible drive mechanisms 34, 36, and 38 to move the wafer chuck 10 as required along a horizontal X axis, along a horizontal Y axis, and about the vertical Z axis, respectively. In any event, an automatic wafer alignment control system 40 is responsive to the position of the pair of spaced alignment marks 20 of the first type on the semiconductive wafer 12 relative to the position of the pair of spaced alignment marks 26 of the second type on the photomask 24, as detected by the split-field objective lens system 30, for controlling the reversible drive mechanisms 34, 36, and 38 to move the wafer chuck 10 as required to precisely align these pairs of alignment marks and, hence, the semiconductive wafer and the photomask.

An illumination and exposure system 42 is employed to direct illumination light through the split-field objective lens system 30, through an opening 44 in the mask holder 22, an onto the alignment-mark-containing portions of the photomask 24 and the semiconductive wafer 12. This illumination and exposure system 42 includes a light source 46, such as a mercury arc lamp, for producing exposure light in the range of 3000–5000 A (preferrably 4000 A) and illumination light above 5000 A. It also includes a condensor lens 48 for directing a beam of this exposure and illumination light into a light pipe 50, which in turn directs this light beam through a pivotally-mounted exposure light filter 52 and onto an inclined semi-transparent mirror 54 mounted in the split-field objective lens system 30. The exposure light filter 52 filters out the light below 5000 A so that only the illumination light is directed through the split-field objective lens system 30 by the inclined semi-transparent mirror during the out-of-contact alignment operation.

Upon completion of the out-of-contact alignment operation, the reversible drive mechanism 28 is again employed to elevate the wafer chuck 10 and thereby position the oxide and photosensitive-film covered upper surface of the semiconductive wafer 12 in contact with the pattern-bearing lower surface of the photomask 24. An air cylinder is then actuated to pivot the exposure light filter 52 out of the path of the light beam from light pipe 50 so that the exposure light of this light beam is also directed through the split-field objective lens system 30, through the alignment-mark-containing portions of the photomask 24, and onto the corresponding portions of the photosensitive film 18 (see FIGS. 3 and 4) on the oxide covered upper surface of the semiconductive wafer 12. The high intensity of the exposure light directed upon those portions of the photosensitive film 18 by the split-field objective lens system 30 overexposes those portions and thereby fully exposes the portions of the photosensitive film masked by the relatively narrow (for example 3 micron) lines of the alignment marks 26 of the photomask 24. This prevents the alignment marks 26 of the photomask 24 from becoming part of either the etch-resistant mask to be formed from the photosensitive film 18 or the oxide emitter diffusion mask to be subsequently formed from the oxide layer 16.

Following the foregoing exposure step, the air cylinder is actuated to return the exposure light filter 52 to its initial position, whereupon the alignment of the semiconductive wafer 12 and the photomask 24 is checked. If any further alignment adjustments should be necessary, the semiconductive wafer 12 and the photomask 24 are again separated, the alignment adjustments then performed, and the oxide and photosensitive film covered upper surface of the semiconductive wafer thereupon repositioned in contact with the pattern bearing lower surface of the photomask. The split-field objective lens system 30 is then rotated out of the operative position shown in FIG. 1 and an inclined exposure mirror 56 rotated into that operative position as shown in FIG. 2. Both the split-field objective lens system 30 and the inclined exposure mirror 56 are mounted on a rotatable turret as shown in the above-mentioned U.S. patent to facilitate this change in their positions. An unfiltered light beam from light source 46 is thereupon directed onto the inclined exposure mirror 56 by another condensor lens 58 of the illumination and exposure system. This light beam is in turn reflected from the exposure mirror 56 through the photomask 24 and onto the entire unmasked surface of the photosensitive film 18 on the oxide covered upper surface of the semiconductive wafer 12, thereby selectively exposing the photosensitive film in accordance with the pattern of the photomask.

Figure 5:
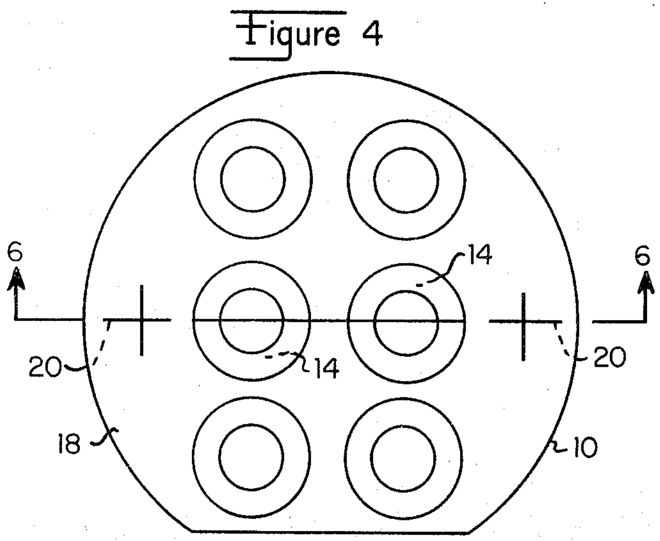
FIG. 5 is a plan view of the semiconductive wafer of FIGS. 3 and 4 after the high-resolution oxide mask of the desired pattern has been formed thereon.
Figure 6:
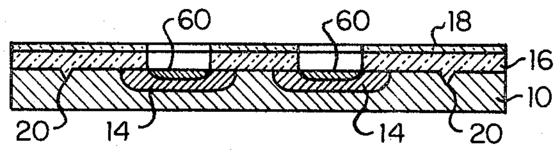
FIG. 6 is a cross-sectional side view of the semiconductive wafer of FIG. 5 taken along the line 6—6.

Upon completion of the last-mentioned exposure step, the unexposed portions of the photosensitive film 18 are removed to form an etch-resistant mask through which the oxide layer 16 is selectively etched as shown in FIGS. 5 and 6. This forms the desired oxide emitter diffusion mask through which the emitter regions 60 are diffused into the base regions 14 as also shown in FIGS. 5 and 6. Since the alignment marks 26 of the photomask 24 are not formed in either the etch-resistant mask or the corresponding oxide emitter diffusion mask, the alignment marks 20 previously formed in the upper surface of the semiconductive wafer 12 may be employed again to facilitate the precise alignment of still other high resolution masks to be formed upon the semiconductive wafer. This significantly reduces the amount of space required for alignment marks 20 upon the semiconductive wafer 12 in order to successively form a plurality of high resolution masks upon the semiconductive wafer in precise alignment with respect to one another.

I claim:

1. A method for employing a photomask to form a corresponding mask of a selected material upon a workpiece, said method comprising the steps of:

depositing a photosensitive film of the selected material upon the workpiece;

aligning one or more alignment marks upon the workpiece with one or more corresponding alignment marks upon the photomask to align the workpiece with the photomask;

directing exposure light onto portions of the photosensitive film masked by the one or more alignment marks of the photomask to fully expose those portions of the photosensitive film and thereby prevent the one or more alignment marks of the photomask from becoming part of the mask of the selected material;

directing exposure light through the photomask onto the entire unmasked surface of the photosensitve film to selectively expose the remaining portions of the photosensitive film in accordance with the photomask; and removing either the unexposed or the exposed portions of the photosensitive film from the workpiece to define the mask of the selected material upon the workpiece.

2. A method as in claim 1 wherein the alignment-mark-containing portions of the photomask are light-field regions.

3. A method as in claim 2 wherein the photosensitive film of the selected material is either a positive or a negative photosensitive film of an etch-resistant material.

4. A method as in claim 3 wherein:

the aligning step is performed by employing a split-field objective lens system to monitor the position of a pair of spaced alignment marks of a first type upon the workpiece relative to a corresponding pair of spaced alignment marks of a second type upon the photomask while moving the workpiece relative to the photomask to bring these pairs of spaced alignment marks into alignment; and the directing steps are thereafter performed by employing an exposure light system to direct exposure light through the split-field objective lens system and the alignment-mark-containing portions of the photomask onto the corresponding portions of the photosensitive film, thereby fully exposing those portions of the photosensitive film masked by the alignment marks of the photomask, and to direct exposure light through the photomask onto the entire unmasked surface of the photosensitive film, thereby selectively exposing the remaining portions of the photosensitive film in accordance with the photomask.

5. Apparatus for aligning a workpiece with a photomask and for selectively exposing a photosensitive film of a selected material upon the workpiece in accordance with the photomask to define a corresponding mask of the selected material upon the workpiece, said apparatus comprising:

a workpiece holder for holding the workpiece;

a mask holder for holding the photomask;

an objective lens system for monitoring the position of one or more alignment marks of a first type upon the workpiece relative to one or more corresponding alignment marks of a second type upon the photomask;

a control system responsive to the monitored position of the one or more alignment marks of the workpiece relative to the one or more alignment marks of the photomask for moving the workpiece holder relative to the mask holder to bring these alignment marks and, hence, the workpiece and the photomask into alignment; and an illumination and exposure system for directing illumination light through the objective lens system while the workpiece and the photomask are being aligned and for thereafter directing exposure light through the objective lens system and the alignment-mark-containing portions of the photomask onto the corresponding portions of the photosensitive film to fully expose those portions of the photosensitive film masked by the one or more alignment marks of the photomask and thereby prevent the one or more alignment marks of the photomask from becoming part of the mask of the selected material;

said illumination and exposure system including means for additionally directing exposure light through the photomask onto the entire unmasked surface of the photosensitive film to selectively expose the remaining portions of the photosensitive film in accordance with the photomask and thereby permit subsequent removal of either the unexposed or the exposed portions of the photosensitive film from the workpiece to define the mask of the selected material thereon.

6. Apparatus as in claim 5 wherein:

said objective lens system is a split-field objective lens system; and said means of the illumination and exposure system comprises a mirror.

7. Apparatus as in claim 6 wherein said illumination and exposure system includes:

a source of illumination and exposure light;

optical means for directing illumination and exposure light from the source along a first optical path into the split-field objective lens system; and a filter movable into the first optical path for filtering out the exposure light while passing the illumination light directed therealong during the alignment of the workpiece and the photomask;

said filter also being movable out of the first optical path for passing the exposure light directed therealong during the exposure of those portions of the photosensitive film masked by the one or more alignment marks of the photomask.

8. Apparatus as in claim 7 wherein said illumination and exposure system further includes optical means for directing exposure light from the source along a second optical path onto the mirror during the exposure of the entire unmasked surface of the photosensitive film upon the workpiece.

9. Apparatus as in claim 8 wherein the alignment-mark-containing portions of the photomask are light field regions.

10. Apparatus as in claim 9 wherein the photosensitive film of the selected material is either a positive or a negative photosensitive film of an etch-resistant material.

11. Apparatus as in claim 10 wherein:

the one or more alignment marks of the workpiece comprise a pair of spaced alignment marks of the first type; and the one or more alignment marks of the photomask comprise a corresponding pair of spaced alignment marks of the second type.

* * * * *

UNITED STATES PATENT AND TRADEMARK OFFICE

CERTIFICATE OF CORRECTION

PATENT NO. : 3,844,655

DATED : October 29, 1974

INVENTOR(S) : Karl-Heinz Johannsmeier

It is certified that error appears in the above–identified patent and that said Letters Patent are hereby corrected as shown below:

Column 4, line 7, "10" should read -- 12 --; and

In Figures 3-6, "10" should read -- 12 --.

Signed and Sealed this

Thirteenth Day of July 1976

[SEAL]

*Attest:*

RUTH C. MASON
*Attesting Officer*

C. MARSHALL DANN
*Commissioner of Patents and Trademarks*